US011095303B1

(12) United States Patent  Wagemans

(10) Patent No.: US 11,095,303 B1
(45) Date of Patent: Aug. 17, 2021

(54) SINGLE-ENDED TO DIFFERENTIAL CIRCUIT

(71) Applicant: Dialog Semiconductor B.V., s-Hertogenbosch (NL)

(72) Inventor: Maikel Wagemans, Den Bosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/916,371

(22) Filed: Jun. 30, 2020

(51) Int. Cl.
*H03M 3/00* (2006.01)
*H03F 3/45* (2006.01)
*G11C 27/02* (2006.01)

(52) U.S. Cl.
CPC .............. *H03M 3/32* (2013.01); *G11C 27/026* (2013.01); *H03F 3/45475* (2013.01); *H03M 3/458* (2013.01)

(58) Field of Classification Search
CPC ..... H03M 3/32; H03M 3/458; H03F 3/45475; G11C 27/026
USPC ...................................... 341/143; 327/94–96
See application file for complete search history.

(56) References Cited

U.S. PATENT DOCUMENTS

| 6,169,427 | B1 * | 1/2001 | Brandt | G11C 27/026 327/94 |
| 7,397,287 | B2 * | 7/2008 | Makihara | G11C 27/026 327/91 |
| 8,947,278 | B2 * | 2/2015 | Nicollini | H03F 3/45475 341/143 |
| 9,444,489 | B2 * | 9/2016 | Roh | H03M 3/30 |

OTHER PUBLICATIONS

"Wideband low-distortion delta-sigma ADC topology," by J. Silva et al., Electronics Letters, vol. 37, No. 12, Jun. 7, 2001, pp. 737-738.
"An Input-Feedforward Delta-Sigma Modulator With Relaxed Timing Constraints," by Qing-Qin Wang et al., IEEE Transactions on Circuits and Systems—II: Express Briefs, vol. 65, No. 3, Mar. 2018, pp. 291-295.
"A 0.5-V 35-μW 85-dB DR Double-Sampled ΔΣ Modulator for Audio Applications", by Zhenglin Yang et al., IEEE Journal of Solid-State Circuits, vol. 47, No. 3, Mar. 2012, pp. 722-735.

(Continued)

*Primary Examiner* — Khai M Nguyen
(74) *Attorney, Agent, or Firm* — Saile Ackerman LLC; Stephen B. Ackerman

(57) ABSTRACT

A single-ended to differential circuit is presented. The circuit may be a single-ended to differential integrator or a single-ended to differential amplifier. The circuit determines a first output and a second output voltage based on an input voltage, first and second reference voltages. The circuit has a first, a second and a third input memory element. The circuit in a first phase, samples a voltage indicative of the input voltage on the first input memory element. The circuit in the first phase, samples a voltage indicative of the first reference voltage on the second input memory element. The circuit in the first phase, samples a voltage indicative of the second reference voltage on the third input memory element. The circuit, in a second phase, determines the first and second output voltage based on the sampled voltages on the first, second, and third input memory elements.

20 Claims, 4 Drawing Sheets

(56) References Cited

OTHER PUBLICATIONS

"A Switched-Capacitor Single-ended to DifferentialStage for A/D Conversion of IRFPA ROIC," by Meng Chen et al., 2012 IEEE 11th International Conference on Solid-State and Integrated Circuit Technology, 29 Oct. 29-Nov. 1, 2012, 3 pages.

"On the Implementation of Input-Feedforward Delta-Sigma Modulators," by Ahmed Gharbiya et al., IEEE Transactions on Circuits and Systems—II: Express Briefs, vol. 53, No. 6, Jun. 2006, pp. 453-457.

Understanding Delta-Sigma Data Converters, Second Edition, by S. Pavan, R. Schreier, G.C Themes, Copyright Wiley-IEEE Press, Jan. 2017, pp. 170-175, ISBN: 9781119258278.

ADC Performance Survey 1997-2020 [Online], by Boris Murmann, Stanford University, Available: http://web.stanford.edu/~murmann/adcsu.

* cited by examiner

SINGLE-ENDED TO DIFFERENTIAL CIRCUIT

TECHNICAL FIELD

The present document relates to a single-ended to differential circuit. In particular, the present document relates to single-ended to differential conversion methods for input-feedforward delta-sigma modulators.

BACKGROUND

The field of this invention lies at the boundary between the analog and digital realms, i.e. analog-to-digital converters (ADCs). In recent years, the resolution and bandwidth of ADCs have steadily been increasing and/or power consumption is slowly decreasing. High resolution is mostly achieved by using an oversampling data converter such as a delta-sigma modulator (DSM). In order to relax requirements to the first integrator stage of a DSM, a feedforward topology can be used.

For obvious reasons, implementation of a data converter is preferably done in a differential fashion. Quite some applications, however, are not limited to differential inputs and require a single-ended input instead. Simply connecting an input signal to one differential input and a common mode signal to the other differential input will result in a loss of resolution of 1-bit (6 dB). Therefore, dedicated single-ended to differential conversion circuits are used. This can be done in the front end, but for power saving reasons, a solution embedded in the ADC is preferable.

SUMMARY

The present document addresses the above mentioned technical problems. In particular, the present document addresses the technical problem of providing a novel single-ended to differential conversion method for input-feedforward delta-sigma modulators. According to an aspect, a single-ended to differential circuit is presented. Depending on the application scenario, the single-ended to differential circuit may be e.g. a single-ended to differential integrator or a single-ended to differential amplifier. The single-ended to differential circuit may be configured to determine a first output voltage and a second output voltage based on an input voltage, a first reference voltage, and a second reference voltage. The input voltage may serve as single-ended input, the two reference voltages may be used as a differential reference, and the first output voltage and the second output voltage may serve as differential output. The single-ended to differential circuit may comprise a first input memory element, a second input memory element, and a third input memory element. The single-ended to differential circuit may be configured to, in a first phase, sample a voltage indicative of the input voltage on the first input memory element. The single-ended to differential circuit may be configured to, in the first phase, sample a voltage indicative of the first reference voltage on the second input memory element. The single-ended to differential circuit may be configured to, in the first phase, sample a voltage indicative of the second reference voltage on the third input memory element. The single-ended to differential circuit may be configured to, in a second phase, determine the first and second output voltage based on the sampled voltages on the first, second, and third input memory elements.

The first output voltage, the second output voltage, the input voltage, the first reference voltage, and the second reference voltage may be analog voltage signals. The first input memory element, the second input memory element, and the third input memory element may be capacitors with equal capacitances. Alternatively, the first input memory element, the second input memory element, and the third input memory element may be inductors with equal inductances.

The single-ended to differential circuit may further comprise a switching circuit configured to receive a control signal. The control (or feedback) signal may be a binary voltage signal which toggles between a first state (e.g. a logical high value) and a second state (e.g. a logical low value). The control signal may also comprise a plurality of binary voltage signal (i.e. a multibit signal), wherein each binary voltage signal toggles between a first state and a second state. The switching circuit may be configured to, during the second phase, couple the second input memory element to the input voltage if the control signal has the first state. The switching circuit may be configured to, during the second phase, couple the second input memory element to the first reference voltage if the control signal has the second state.

Further, the switching circuit may be configured to, during the second phase, couple the third input memory element to the input voltage if the control signal has the second state. The switching circuit may be configured to, during the second phase, couple the third input memory element to the second reference voltage if the control signal has the first state.

The switching circuit may be configured to, during the second phase, couple the first input memory element to the first reference voltage if the control signal has the first state. The switching circuit may be configured to, during the second phase, couple the first input memory element to the second reference voltage if the control signal has the second state.

The switching circuit may be configured to, during the first phase, couple the first input memory element such that the voltage indicative of the input voltage is sampled on the first input memory element. The switching circuit may be configured to, during the first phase, couple the second input memory element such that the voltage indicative of the first reference voltage is sampled on the second input memory element. The switching circuit may be configured to, during the first phase, couple the third input memory element such that the voltage indicative of the second reference voltage is sampled on the third input memory element.

More specifically, the switching circuit may be configured to, during the first phase, couple the first input memory element between the input voltage and a common mode voltage. The switching circuit may be configured to, during the first phase, couple the second input memory element between the first reference voltage and the common mode voltage. The switching circuit may be configured to, during the first phase, couple the third input memory element between the second reference voltage and the common mode voltage.

The single-ended to differential circuit may further comprise a first output memory element coupled to the first output voltage, and a second output memory element coupled to the second output voltage. The switching circuit may be configured to, during the second phase, couple the first input memory element to the first output memory element. The switching circuit may be configured to, during the second phase, couple both the second input memory element and the third input memory element to the second output memory element.

The single-ended to differential circuit may further comprise an operational amplifier. The first output memory element may be coupled between a non-inverting input of the operational amplifier and an inverting output of the operational amplifier. The second output memory element may be coupled between an inverting input of the operational amplifier and a non-inverting output of the operational amplifier. Alternatively, the first output memory element may be coupled between an inverting input of the operational amplifier and a non-inverting output of the operational amplifier. The second output memory element may be coupled between a non-inverting input of the operational amplifier and an inverting output of the operational amplifier.

The switching circuit may comprise a switching element configured to couple the first input memory element to a common mode voltage. Moreover, the switching circuit may comprise another switching element configured to couple both the second input memory element and the third input memory element to the common mode voltage. The switching circuit may comprise yet another switching element configured to couple the first input memory element to the first output memory element. The switching circuit may comprise a further switching element configured to couple both the second input memory element and the third input memory element to the second output memory element.

The switching circuit may comprise a first switching element configured to couple the first reference voltage to the first input memory element. The switching circuit may comprise a second switching element configured to couple the second reference voltage to the first input memory element. The switching circuit may comprise a third switching element configured to couple the input voltage to the first input memory element. The switching circuit may comprise a fourth switching element configured to couple the input voltage to the second input memory element. The switching circuit may comprise a fifth switching element configured to couple the input voltage to the third input memory element. The switching circuit may comprise a sixth switching element configured to couple the first reference voltage to the second input memory element. The switching circuit may comprise a seventh switching element configured to couple the second reference voltage to the third input memory element.

According to another aspect, a method of operating a single-ended to differential circuit is described. Depending on the application scenario, the single-ended to differential circuit may be e.g. a single-ended to differential integrator or a single-ended to differential amplifier. The method may comprise steps which correspond to the functional features of the single-ended to differential circuit described in the present document. In particular, the single-ended to differential circuit may determine a first output voltage and a second output voltage based on an input voltage, a first reference voltage, and a second reference voltage. The single-ended to differential circuit may comprise a first input memory element, a second input memory element, and a third input memory element. The method may comprise sampling, in a first phase, a voltage indicative of the input voltage on the first input memory element. The method may comprise sampling, in the first phase, a voltage indicative of the first reference voltage on the second input memory element. The method may comprise sampling, in the first phase, a voltage indicative of the second reference voltage on the third input memory element. The method may comprise determining, in a second phase, the first and second output voltage based on the sampled voltages on the first, second, and third input memory elements.

The first input memory element, the second input memory element, and the third input memory element may be capacitors with equal capacitances.

The method may comprise receiving, by a switching circuit, a control signal. The method may comprise coupling, by the switching circuit, during the second phase, the second input memory element to the input voltage if the control signal has a first state, and coupling the second input memory element to the first reference voltage if the control signal has a second state.

Alternatively or additionally, the method may comprise coupling, by the switching circuit, during the second phase, the third input memory element to the input voltage if the control signal has the second state, and coupling the third input memory element to the second reference voltage if the control signal has the first state.

The method may comprise coupling, by the switching circuit, during the second phase, the first input memory element to the first reference voltage if the control signal has the first state, and coupling the first input memory element to the second reference voltage if the control signal has the second state.

The method may comprise, during the first phase, coupling, by the switching circuit, the first input memory element such that the voltage indicative of the input voltage is sampled on the first input memory element. The method may comprise, during the first phase, coupling, by the switching circuit, the second input memory element such that the voltage indicative of the first reference voltage is sampled on the second input memory element. The method may comprise, during the first phase, coupling, by the switching circuit, the third input memory element such that the voltage indicative of the second reference voltage is sampled on the third input memory element.

The method may comprise, during the first phase, coupling, by the switching circuit, the first input memory element between the input voltage and a common mode voltage. The method may comprise, during the first phase, coupling, by the switching circuit, the second input memory element between the first reference voltage and the common mode voltage. The method may comprise, during the first phase, coupling, by the switching circuit, the third input memory element between the second reference voltage and the common mode voltage.

The method may comprise coupling a first output memory element to the first output voltage. The method may comprise coupling a second output memory element to the second output voltage. The method may comprise, during the second phase, coupling, by the switching circuit, the first input memory element to the first output memory element. The method may comprise, during the second phase, coupling, by the switching circuit, both the second input memory element and the third input memory element to the second output memory element.

The single-ended to differential circuit may further comprise an operational amplifier. The method may comprise coupling the first output memory element between a non-inverting input of the operational amplifier and an inverting output of the operational amplifier. And, the method may comprise coupling the second output memory element between an inverting input of the operational amplifier and a non-inverting output of the operational amplifier.

Alternatively, the method may comprise coupling the first output memory element between an inverting input of the operational amplifier and a non-inverting output of the operational amplifier. And, the method may comprise coupling the second output memory element between a non-inverting input of the operational amplifier and an inverting output of the operational amplifier.

The method may comprise coupling, by a switching element of the switching circuit, the first input memory element to a common mode voltage. The method may comprise coupling, by another switching element of the switching circuit, both the second input memory element and the third input memory element to the common mode voltage. The method may comprise coupling, by a switching element of the switching circuit, the first input memory element to the first output memory element. The method may comprise coupling, by another switching element of the switching circuit, both the second input memory element and the third input memory element to the second output memory element.

The method may comprise coupling, by a first switching element of the switching circuit, the first reference voltage to the first input memory element. The method may comprise coupling, by a second switching element of the switching circuit, the second reference voltage to the first input memory element. The method may comprise coupling, by a third switching element of the switching circuit, the input voltage to the first input memory element. The method may comprise coupling, by a fourth switching element of the switching circuit, the input voltage to the second input memory element. The method may comprise coupling, by a fifth switching element of the switching circuit, the input voltage to the third input memory element. The method may comprise coupling, by a sixth switching element of the switching circuit, the first reference voltage to the second input memory element. The method may comprise coupling, by a seventh switching element of the switching circuit, the second reference voltage to the third input memory element.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DESCRIPTION

Figure 1:
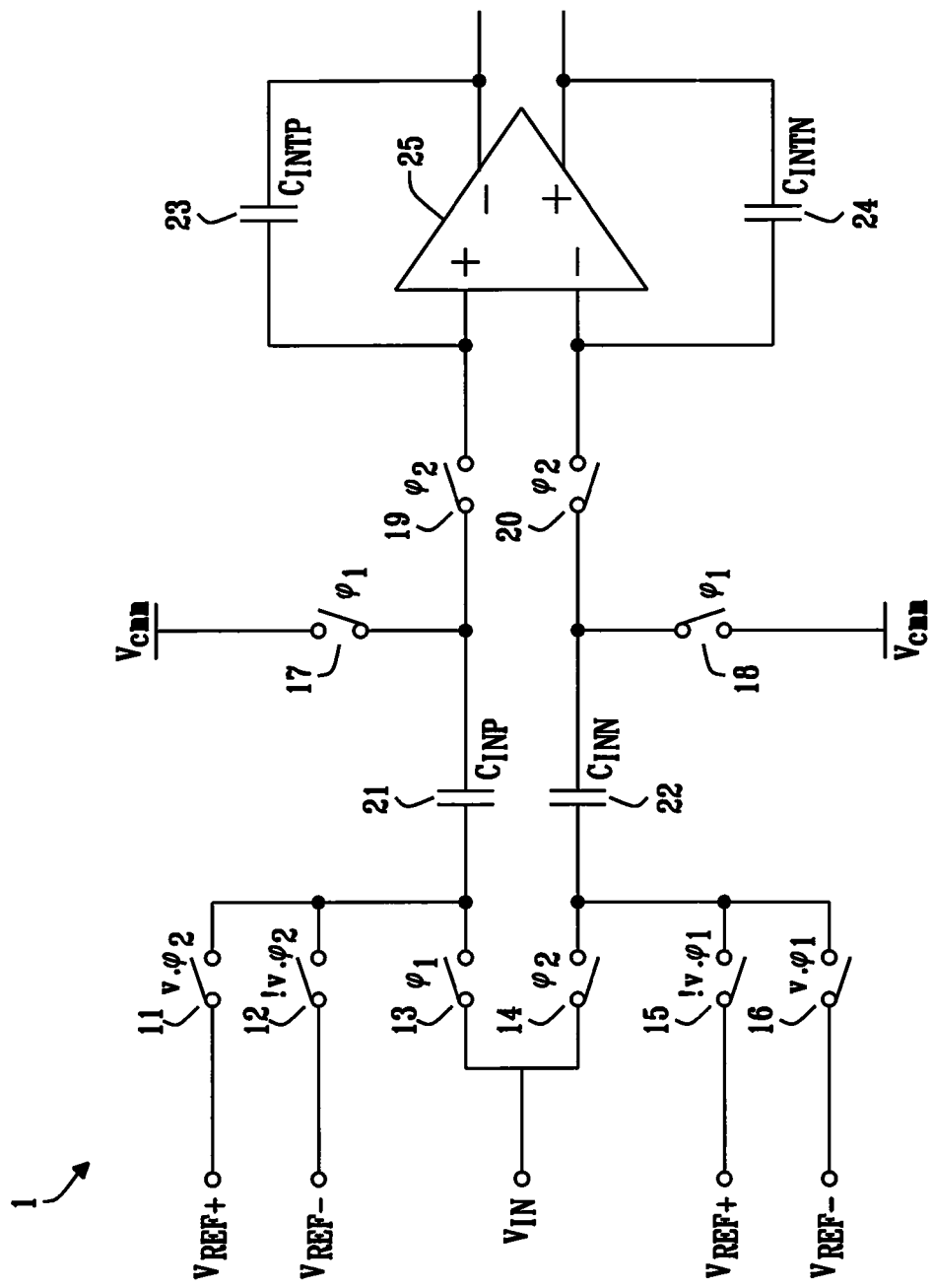
FIG. 1 shows an exemplary switched-capacitor integrator with single-ended to differential conversion.

FIG. 1 shows an exemplary switched-capacitor integrator 1 with single-ended to differential conversion. It comprises a first switching element 11, a second switching element 12, a third switching element 13, a fourth switching element 14, a fifth switching element 15, a sixth switching element 16, a seventh switching element 17, an eighth switching element 18, a ninth switching element 19, and a tenth switching element 20. The latter switching elements may form part of a switching circuit. Moreover, it comprises a first sample capacitor 21, a second sample capacitor 22, a first integration capacitor 23, a second integration capacitor 24, and an operational amplifier 25.

Figure 2:
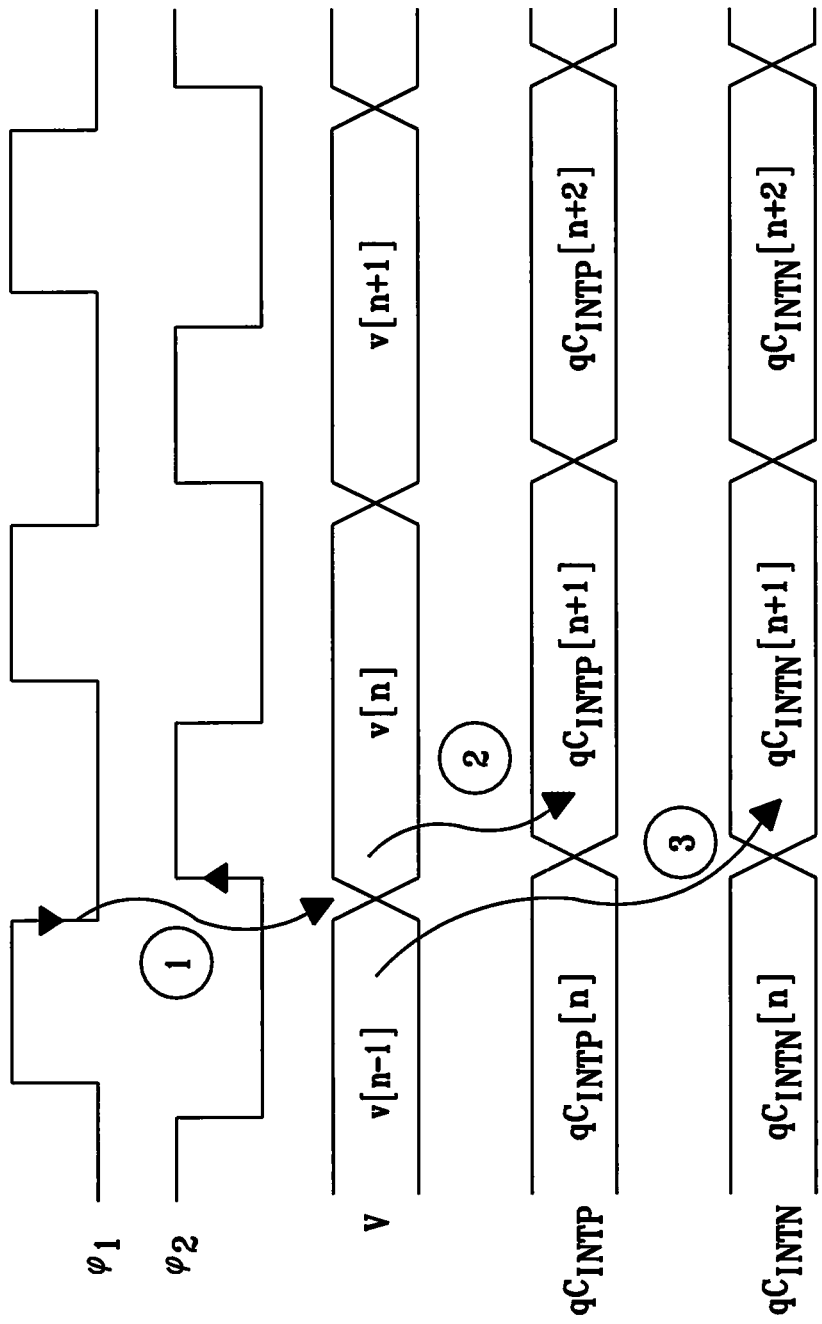
FIG. 2 shows a timing diagram for the switched-capacitor integrator of FIG. 1.

The circuit is controlled with the help of a first phase signal $\varphi_1$, a second phase signal $\varphi_2$, and a (1-bit) control signal v. As can be seen in FIG. 2, the first phase signal $\varphi_1$ and the second phase signal $\varphi_2$ are two periodic, binary signals which alternately have a high signal value and a low signal value, wherein times with high signal values are separated by dead times during which both the first phase signal $\varphi_1$ and the second phase signal $\varphi_2$ have a low signal value. In phase 1 (i.e. when the first phase signal $\varphi_1$ has a high signal value), the charge on the first sample capacitor 21 (Cinp) is given by the following formula:

$$qCinp1=(Vin-Vcmm)*Cinp,$$

wherein Vin denotes the input voltage, Vcmm denotes the common mode voltage, and Cinp is the capacitance of the first sample capacitor 21. Further, in phase 1, the charge on the second sample capacitor 22 (Cinn) is given by the following formula:

$$qCinn1=(Vdac-Vcmm)*Cinn,$$

wherein Cinn is the capacitance of the second sample capacitor 22. The 1-bit DAC (Digital Analogue Converter) voltage is: Vdac=(!v*Vref+)+(v*Vref−), wherein Vref+ denotes a first reference voltage and Vref− denotes a second reference voltage. In other words, depending on the control signal v, the voltage Vdac has either the signal value of Vref+ or the signal value of Vref−.

Then, in phase 2 (i.e. when the second phase signal $\varphi_2$ has a high signal value), the sampled charge on both sample capacitors Cinp and Cinn is integrated to the integration capacitors Cintp and Cintn, respectively. The input of the amplifier 25 is a virtual ground node with a voltage equal to the common mode voltage Vcmm.

In phase 2, the charge on the first integration capacitor 23 (Cintp) can be written as $$qCintp=qCintp+qCinp1-(Vdac-Vcmm)\\*Cinp=qCintp+(Vin-Vdac)*Cinp.$$

In phase 2, the charge on the second integration capacitor 24 (Cintn) can be written as $$qCintn=qCintn+qCinn1-(Vin-Vcmm)*Cinn=qCintn+$$

$$(Vdac-Vin)*Cinn.$$

The charge on both Cintp and Cintn results in a voltage at the output of the amplifier 25:

$$Voutp=qCintp/Cintp=Voutp+(Vin-Vdac)*Cinp/Cintp$$

$$Voutn=qCintn/Cintn=Voutn+(Vdac-Vin)*Cinn/Cintn$$

Since the input voltage Vin is a single-ended signal, and Voutp and Voutn represent a differential signal, a single-ended to differential conversion takes place. For example, Cinn may be equal to Cinp, and Cintn may be equal to Cintp. Thus, the output voltage may be given by the below formula:

$$Vout=Voutp-Voutn=Vout+2*(Vin-Vdac)*Cinn/Cintn.$$

One problem with the circuit in FIG. 1 is that the control signal v needs to be stable before phase 1. That is, the circuit in FIG. 1 requires the control signal v to be available even before its input is stable. This timing constraint, however, may complicate the implementation of feed-forward architectures. FIG. 2 shows a timing diagram for the switched-capacitor integrator of FIG. 1. At the falling edge of phase 1, the quantizer is causing the control signal v to change state. Due to the circuit operation, the charge integrated into CINTP is related to the current quantizer state, while the charge integrated into CINTN is related to the previous quantizer state.

Figure 3:
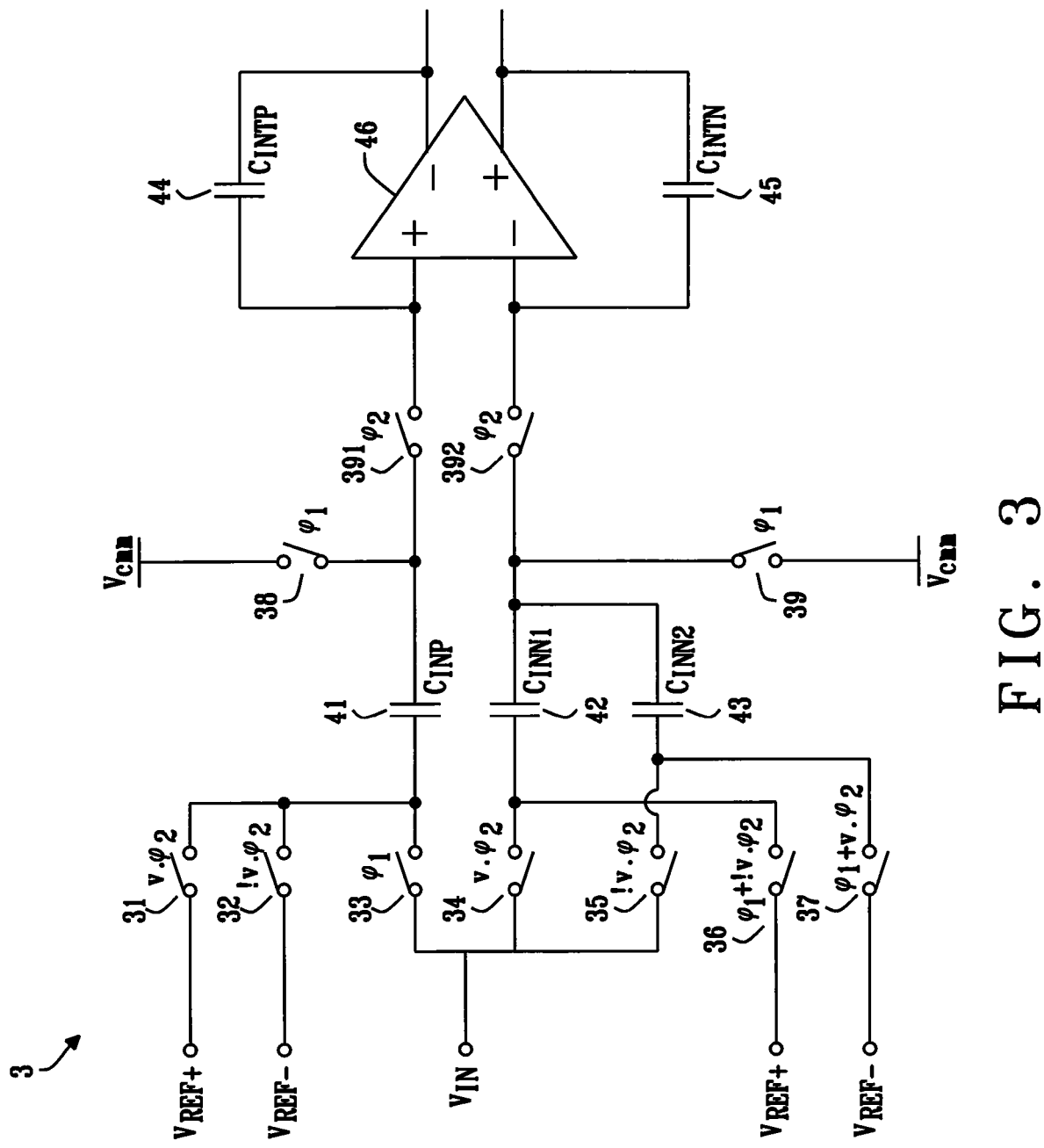
FIG. 3 shows another exemplary switched-capacitor integrator with single-ended to differential conversion.

FIG. 3 shows another exemplary switched-capacitor integrator 3 with single-ended to differential conversion. It comprises a first switching element 31, a second switching element 32, a third switching element 33, a fourth switching element 34, a fifth switching element 35, a sixth switching element 36, a seventh switching element 37, an eighth switching element 38, a ninth switching element 39, a tenth switching element 391, and an eleventh switching element 392. The latter switching elements may form part of a switching circuit. Moreover, it comprises a first sample capacitor 41 (first input memory element), a second sample capacitor 42 (second input memory element), a third sample capacitor 43 (third input memory element), a first integration capacitor 44 (first output memory element), a second integration capacitor 45 (second output memory element), and an operational amplifier 46.

During phase 1, both minimum and maximum DAC reference voltages (i.e. VREF− and VREF+) are sampled on separate memory elements (e.g. capacitors). In phase 2, the appropriate memory element is chosen. In this way, the decisions are effectively postponed from phase 1 to phase 2, thereby allowing extra slack. As a result, the control signal v needs to be stable before phase 2.

Figure 4:
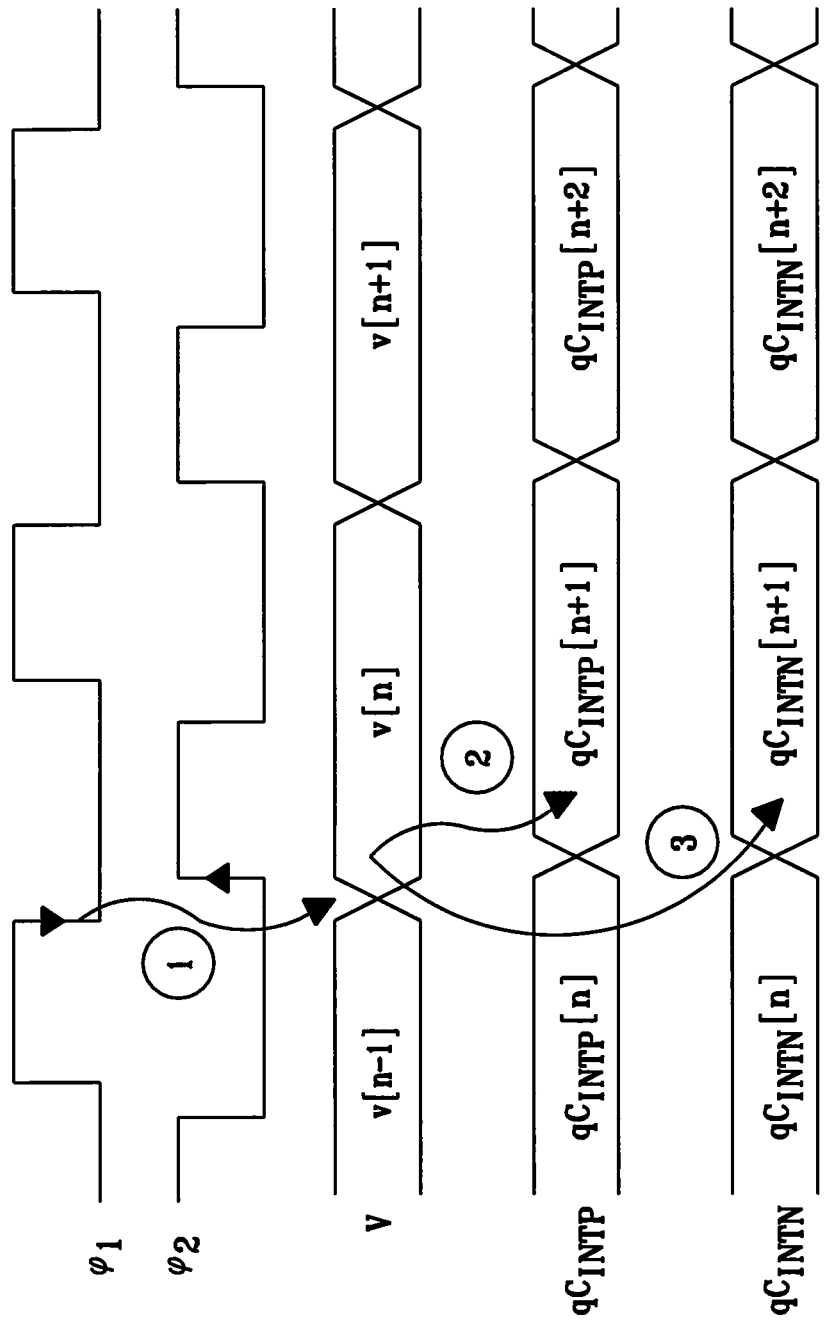
FIG. 4 shows a timing diagram for the switched-capacitor integrator of FIG. 3.

Hence, the invention improves the timing of the circuit in FIG. 1 by adding memory elements. The timing diagram for the proposed method is shown in FIG. 4. Now the charge of both CINTP and CINTN are related to the current quantizer output (2) and (3), which relaxes timing of the control signal v, and avoids complicated compensation loops.

This scheme can easily be extended into a multi-bit solution by dividing the two memory elements (CINN1 and CINN2) into segments without enlarging the total size. Mismatch between the three memory elements (CINP, CINN1, CINN2) can lead to offset and gain errors. When this is a concern, well known chopping and Dynamic Element Matching (DEM) techniques can be employed. When adding chopping, the circuit becomes symmetrical again.

In conclusion, the proposed single-ended to differential conversion method may be embedded inside an ADC which is an input-feedforward DSM. A subtraction of two signals (e.g. input minus feedback) may be performed while relaxing the timing constraints for the control signal. The invention allows the control signal to be available after phase 1 which is required for operation with input-feedforward DSMs.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A single-ended to differential circuit configured to determine a first output voltage and a second output voltage based on an input voltage, a first reference voltage, and a second reference voltage, the single-ended to differential circuit comprising
   a first input memory element,
   a second input memory element, and
   a third input memory element,
wherein the single-ended to differential circuit is configured to, in a first phase, sample
   a voltage indicative of the input voltage on the first input memory element,
   a voltage indicative of the first reference voltage on the second input memory element, and
   a voltage indicative of the second reference voltage on the third input memory element,
wherein the single-ended to differential circuit is configured to, in a second phase, determine the first and second output voltage based on the sampled voltages on the first, second, and third input memory elements;
and wherein the single-ended to differential circuit further comprises a switching circuit configured to receive a control signal and configured to, during the second phase, perform at least one of the following three coupling steps
   coupling the second input memory element to the input voltage if the control signal has a first state, or to the first reference voltage if the control signal has a second state,
   coupling the third input memory element to the input voltage if the control signal has the second state, or couple to the second reference voltage if the control signal has the first state, or
   coupling the first input memory element to the first reference voltage if the control signal has the first state, or to the second reference voltage if the control signal has the second state.

2. The single-ended to differential circuit according to claim 1, wherein the first input memory element, the second input memory element, and the third input memory element are capacitors with equal capacitances.

3. The single-ended to differential circuit according to claim 1, further comprising a switching circuit configured to, during the first phase,
   couple the first input memory element such that the voltage indicative of the input voltage is sampled on the first input memory element,
   couple the second input memory element such that the voltage indicative of the first reference voltage is sampled on the second input memory element, and
   couple the third input memory element such that the voltage indicative of the second reference voltage is sampled on the third input memory element.

4. The single-ended to differential circuit according to claim 1, further comprising a switching circuit configured to, during the first phase,
   couple the first input memory element between the input voltage and a common mode voltage,
   couple the second input memory element between the first reference voltage and the common mode voltage, and
   couple the third input memory element between the second reference voltage and the common mode voltage.

5. The single-ended to differential circuit according to claim 1, further comprising
a first output memory element coupled to the first output voltage, and
a second output memory element coupled to the second output voltage,
wherein the single-ended to differential circuit further comprises a switching circuit configured to, during the second phase,
couple the first input memory element to the first output memory element, and
couple both the second input memory element and the third input memory element to the second output memory element.

6. The single-ended to differential circuit according to claim 5, further comprising an operational amplifier, wherein
the first output memory element is coupled between a non-inverting input of the operational amplifier and an inverting output of the operational amplifier, and wherein
the second output memory element is coupled between an inverting input of the operational amplifier and a non-inverting output of the operational amplifier.

7. The single-ended to differential circuit according to claim 5, further comprising an operational amplifier, wherein
the first output memory element is coupled between an inverting input of the operational amplifier and a non-inverting output of the operational amplifier, and wherein
the second output memory element is coupled between a non-inverting input of the operational amplifier and an inverting output of the operational amplifier.

8. The single-ended to differential circuit according to claim 1, further comprising a switching circuit with
a switching element configured to couple the first input memory element to a common mode voltage, and
a switching element configured to couple both the second input memory element and the third input memory element to the common mode voltage.

9. The single-ended to differential circuit according to claim 1, wherein the switching circuit comprises
a switching element configured to couple the first input memory element to the first output memory element, and
a switching element configured to couple both the second input memory element and the third input memory element to the second output memory element.

10. The single-ended to differential circuit according to claim 1, wherein the switching circuit comprises
a first switching element configured to couple the first reference voltage to the first input memory element,
a second switching element configured to couple the second reference voltage to the first input memory element,
a third switching element configured to couple the input voltage to the first input memory element,
a fourth switching element configured to couple the input voltage to the second input memory element,
a fifth switching element configured to couple the input voltage to the third input memory element,
a sixth switching element configured to couple the first reference voltage to the second input memory element,
a seventh switching element configured to couple the second reference voltage to the third input memory element.

11. A method of operating a single-ended to differential circuit, wherein the single-ended to differential circuit determines a first output voltage and a second output voltage based on an input voltage, a first reference voltage, and a second reference voltage, and wherein the single-ended to differential circuit comprises a first input memory element, a second input memory element, and a third input memory element, the method comprising
sampling, in a first phase, a voltage indicative of the input voltage on the first input memory element,
sampling, in the first phase, a voltage indicative of the first reference voltage on the second input memory element,
sampling, in the first phase, a voltage indicative of the second reference voltage on the third input memory element, and
determining, in a second phase, the first and second output voltage based on the sampled voltages on the first, second, and third input memory elements, and
receiving, by a switching circuit, a control signal,
wherein the method comprises at least one of the following three coupling steps
coupling the second input memory element, by the switching circuit, during the second phase, to the input voltage if the control signal has a first state, or to the first reference voltage if the control signal has a second state,
coupling the third input memory element, by the switching circuit, during the second phase, to the input voltage if the control signal has the second state, or to the second reference voltage if the control signal has the first state,
coupling the first input memory element, by the switching circuit, during the second phase, to the first reference voltage if the control signal has the first state, or to the second reference voltage if the control signal has the second state.

12. The method according to claim 11, wherein the first input memory element, the second input memory element, and the third input memory element are capacitors with equal capacitances.

13. The method according to claim 11, comprising, during the first phase,
coupling, by a switching circuit, the first input memory element such that the voltage indicative of the input voltage is sampled on the first input memory element,
coupling, by the switching circuit, the second input memory element such that the voltage indicative of the first reference voltage is sampled on the second input memory element, and
coupling, by the switching circuit, the third input memory element such that the voltage indicative of the second reference voltage is sampled on the third input memory element.

14. The method according to claim 11, comprising, during the first phase,
coupling, by a switching circuit, the first input memory element between the input voltage and a common mode voltage,
coupling, by the switching circuit, the second input memory element between the first reference voltage and the common mode voltage, and
coupling, by the switching circuit, the third input memory element between the second reference voltage and the common mode voltage.

15. The method according to claim 11, comprising
coupling a first output memory element to the first output voltage, and coupling a second output memory element to the second output voltage, wherein the single-ended to differential circuit further comprises a switching circuit, and wherein the method comprises, during the second phase, coupling, by the switching circuit, the first input memory element to the first output memory element, and coupling, by the switching circuit, both the second input memory element and the third input memory element to the second output memory element.

16. The method according to claim 15, wherein the single-ended to differential circuit further comprises an operational amplifier, wherein the method comprises coupling the first output memory element between a non-inverting input of the operational amplifier and an inverting output of the operational amplifier, and coupling the second output memory element between an inverting input of the operational amplifier and a non-inverting output of the operational amplifier.

17. The method according to claim 15, wherein the single-ended to differential circuit further comprises an operational amplifier, wherein the method comprises coupling the first output memory element between an inverting input of the operational amplifier and a non-inverting output of the operational amplifier, and coupling the second output memory element between a non-inverting input of the operational amplifier and an inverting output of the operational amplifier.

18. The method according to claim 11, comprising coupling, by a switching element of the switching circuit, the first input memory element to a common mode voltage, and coupling, by another switching element of the switching circuit, both the second input memory element and the third input memory element to the common mode voltage.

19. The method according to claim 11, comprising coupling, by a switching element of the switching circuit, the first input memory element to the first output memory element, and coupling, by another switching element of the switching circuit, both the second input memory element and the third input memory element to the second output memory element.

20. The method according to claim 11, comprising coupling, by a first switching element of the switching circuit, the first reference voltage to the first input memory element, coupling, by a second switching element of the switching circuit, the second reference voltage to the first input memory element, coupling, by a third switching element of the switching circuit, the input voltage to the first input memory element, coupling, by a fourth switching element of the switching circuit, the input voltage to the second input memory element, coupling, by a fifth switching element of the switching circuit, the input voltage to the third input memory element, coupling, by a sixth switching element of the switching circuit, the first reference voltage to the second input memory element, coupling, by a seventh switching element of the switching circuit, the second reference voltage to the third input memory element.

* * * * *